United States Patent
Arai et al.

(10) Patent No.: US 9,147,641 B2
(45) Date of Patent: Sep. 29, 2015

(54) SEMICONDUCTOR DEVICE

(71) Applicant: Kabushiki Kaisha Toshiba, Minato-ku (JP)

(72) Inventors: Norihisa Arai, Saitama-ken (JP); Tsutomu Takahashi, Kanagawa-ken (JP); Kazuo Hatakeyama, Tokyo (JP); Kazuki Uchino, Kanagawa-ken (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 13 days.

(21) Appl. No.: 14/017,454

(22) Filed: Sep. 4, 2013

(65) Prior Publication Data

US 2014/0232012 A1 Aug. 21, 2014

(30) Foreign Application Priority Data

Feb. 18, 2013 (JP) ................. 2013-029415

(51) Int. Cl.
*H01L 23/48* (2006.01)
(52) U.S. Cl.
CPC ........ *H01L 23/481* (2013.01); *H01L 2924/0002* (2013.01)
(58) Field of Classification Search
CPC ....... H01L 23/48; H01L 23/552; H01L 29/40; H01L 29/00; H01L 29/167; H01L 29/792
USPC ......... 257/774, 700, 723, 724, 775, 324, 327, 257/329, 330, 331, 332
See application file for complete search history.

(56) References Cited

U.S. PATENT DOCUMENTS

| 2008/0087952 A1* | 4/2008 | Pfirsch ................... 257/334 |
| 2010/0237386 A1 | 9/2010 | Lin et al. |
| 2012/0289003 A1* | 11/2012 | Hirler et al. ............... 438/138 |
| 2012/0292784 A1 | 11/2012 | Nishio |
| 2013/0026536 A1* | 1/2013 | Corona et al. ............ 257/139 |

FOREIGN PATENT DOCUMENTS

| JP | 2002-237468 | 8/2002 |
| JP | 2008-226882 A | 9/2008 |
| JP | 2009-88336 A | 4/2009 |
| JP | 2011-176003 | 9/2011 |
| JP | 2011-176100 | 9/2011 |
| WO | WO 2005/086216 A1 | 9/2005 |

OTHER PUBLICATIONS

Japanese Office Action dated May 8, 2015, issued in Japanese Patent Application No. 2013-029415 (with English translation).

* cited by examiner

*Primary Examiner* — Chuong A Luu
(74) *Attorney, Agent, or Firm* — Oblon, McClelland, Maier & Neustadt, L.L.P.

(57) ABSTRACT

According to one embodiment, a semiconductor device includes: a semiconductor layer of a first conductivity type, the semiconductor layer having a first surface and a second surface on an opposite side to the first surface; a plurality of conductive layers extending in a direction from the first surface side toward the second surface side of the semiconductor layer; a first semiconductor region of a second conductivity type surrounding part of each of the plurality of conductive layers on the second surface side of the semiconductor layer, a portion other than a front surface of the first semiconductor region being surrounded by the semiconductor layer; and an insulating film provided between each of the plurality of conductive layers and the semiconductor layer and between each of the plurality of conductive layers and the first semiconductor region.

8 Claims, 7 Drawing Sheets ial No. 2013-029415,
SEMICONDUCTOR DEVICE

CROSS-REFERENCE TO RELATED APPLICATIONS

This application is based upon and claims the benefit of priority from Japanese Patent Application No. 2013-029415, filed on Feb. 18, 2013; the entire contents of which are incorporated herein by reference.

FIELD

Embodiments described herein relate generally to a semiconductor device.

BACKGROUND

A through via (through silicon via, TSV) is introduced as a technology whereby a plurality of semiconductor chips can be mounded at high density. In the case where the semiconductor is silicon (Si), the through via is a conductive layer penetrating from the back surface to the front surface of the silicon substrate, for example. A plurality of semiconductor chips are electrically connected via the respective through vias to mount the plurality of semiconductor chips at high density; thereby, high-speed data transfer is enabled.

However, since a via hole for providing the through via is formed deep in a semiconductor substrate, the aspect ratio becomes higher and the etching processing thereof becomes more difficult as the miniaturization of semiconductor devices progresses. Consequently, the reliability of semiconductor devices including the through via may be reduced.

For example, until now, for an electrode to be electrically connected to a through via, there has been a case where a faulty connection (open) between an interconnection layer existing between the through via and the electrode and the through via occurs, and as a result a faulty connection between the through via and the electrode occurs. To deal with this, a plurality of through vias have been provided to connect one of the plurality of through vias and the interconnection layer; thereby, a faulty connection has been prevented.

However, since a via hole for providing the through via is formed deep in a semiconductor substrate, the aspect ratio becomes higher and the etching processing thereof becomes more difficult as the miniaturization of semiconductor devices progresses. Consequently, an operational malfunction, a faulty operation, and a yield reduction of semiconductor devices including the through via may be caused.

DETAILED DESCRIPTION

Figure 1A:
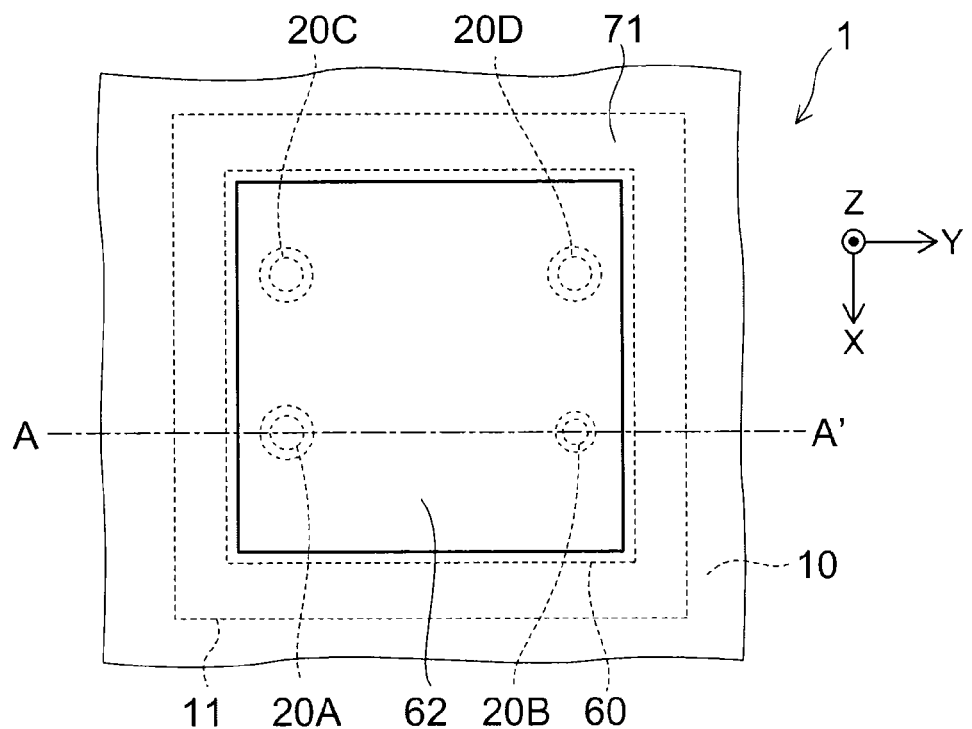
FIG. 1A is a schematic plan view showing a semiconductor device according to a first embodiment.

In general, according to one embodiment, a semiconductor device includes: a semiconductor layer of a first conductivity type, the semiconductor layer having a first surface and a second surface on an opposite side to the first surface; a plurality of conductive layers extending in a direction from the first surface side toward the second surface side of the semiconductor layer; a first semiconductor region of a second conductivity type surrounding part of each of the plurality of conductive layers on the second surface side of the semiconductor layer, a portion other than a front surface of the first semiconductor region being surrounded by the semiconductor layer; and an insulating film provided between each of the plurality of conductive layers and the semiconductor layer and between each of the plurality of conductive layers and the first semiconductor region.

Hereinbelow, embodiments are described with reference to the drawings. In the following description, identical components are marked with the same reference numerals, and a description of components once described is omitted as appropriate.

First Embodiment

Figure 1B:
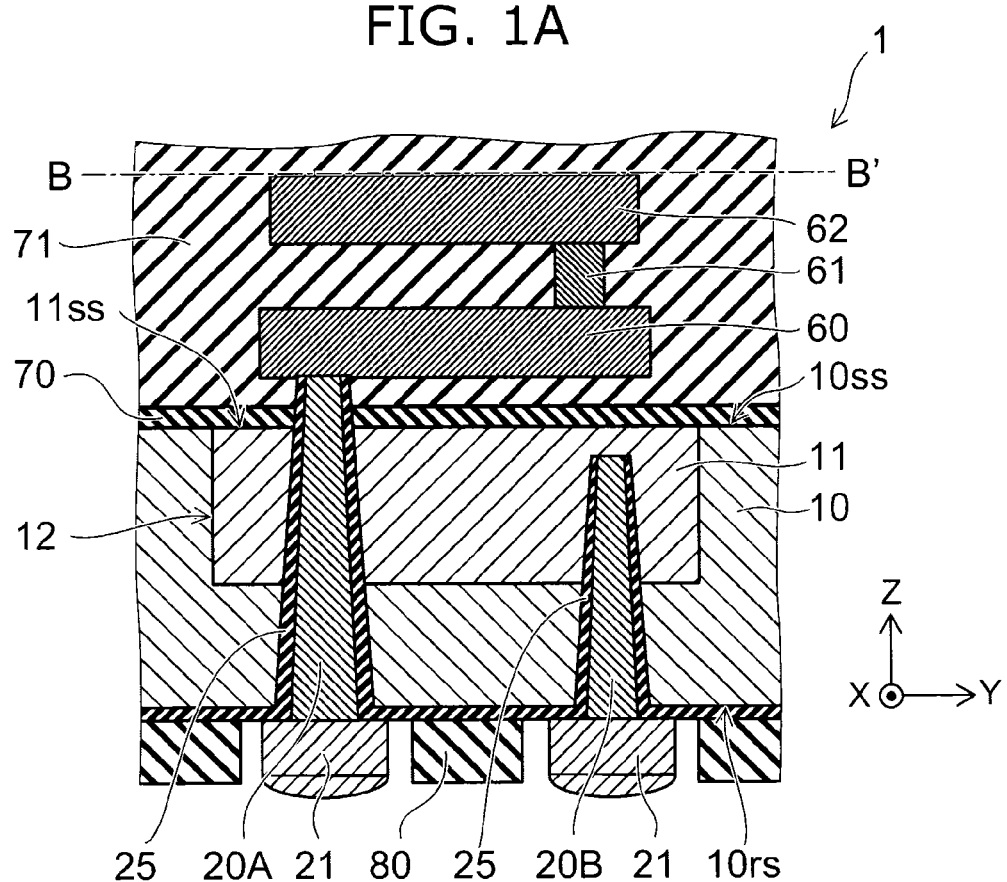
FIG. 1B is a schematic cross-sectional view showing the semiconductor device according to the first embodiment.

FIG. 1A is a schematic plan view showing a semiconductor device according to a first embodiment, and FIG. 1B is a schematic cross-sectional view showing the semiconductor device according to the first embodiment.

FIG. 1A shows a cross section taken along line B-B' of FIG. 1B, and FIG. 1B shows a cross section taken along line A-A' of FIG. 1A.

A semiconductor device 1 includes a semiconductor layer 10, an electrode 60, a plurality of conductive layers 20A to 20D, a semiconductor region 11 (a first semiconductor region), and an insulating film 25. The semiconductor device 1 is part of a multi-chip package semiconductor device, for example.

The semiconductor layer 10 is a p-type (first conductivity type) semiconductor layer, for example. The semiconductor layer 10 has a back surface 10$rs$ (a first surface) and a front surface 10$ss$ (a second surface) on the opposite side to the back surface 10$rs$. The semiconductor layer 10 is a semiconductor substrate fashioned in a thin film form. A semiconductor substrate is made into a thin film form by grinding the back surface side of the semiconductor substrate, for example (described later). The electrode 60 is provided on the front surface 10$ss$ side of the semiconductor layer 10.

The plurality of conductive layers 20A to 20D extend in the direction from the back surface 10$rs$ side toward the front surface 10$ss$ side of the semiconductor layer 10. One of the conductive layers 20A to 20D is a through via (TSV). The plurality of conductive layers 20A to 20D include the conductive layer 20A in contact with the electrode 60 (a first via) and the conductive layer 20B in contact with the semiconductor region 11 and not in contact with the electrode 60 (a second via), for example. In other words, the conductive layer 20B stops partway through the semiconductor region 11. Each of the conductive layers 20C and 20D is in contact with the electrode 60. Each of the conductive layers 20A to 20D is connected to an electrode 21. The electrode 21 is exposed from the semiconductor layer 10.

The number of conductive layers 20A to 20D is an example and is not limited thereto. At least one conductive layer may be provided between the back surface 10rs and the front surface 10ss of the semiconductor layer 10, for example. The conductive layer in contact with the electrode 60 and the conductive layer not in contact with the electrode 60 are an example. The number of conductive layers in contact with the electrode 60 and the number of conductive layers not in contact with the electrode 60 are not limited to the numbers illustrated.

The semiconductor region 11 is an n-type (second conductivity type) semiconductor region, for example. The semiconductor region 11 surrounds part (for example, an upper portion) of each of the plurality of conductive layers 20A to 20D on the front surface 10ss side of the semiconductor layer 10. Portions other than the front surface 11ss of the semiconductor region 11 (for example, a lower portion and a side portion of the semiconductor region 11) are surrounded by the semiconductor layer 10. By the semiconductor region 11 and the semiconductor layer 10 being in contact, a pn junction 12 is formed in the semiconductor layer 10. The semiconductor region 11 may be referred to as a well region.

The insulating film 25 is provided between each of the plurality of conductive layers 20A to 20D and the semiconductor layer 10 and between each of the plurality of conductive layers 20A to 20D and the semiconductor region 11. The insulating film 25 is further provided under the back surface 10rs of the semiconductor layer 10. An insulating layer 80 is provided under the back surface 10rs of the semiconductor layer 10 via the insulating film 25. The electrode 21 is exposed from the insulating layer 80.

The semiconductor device 1 further includes an insulating film 70 provided on the semiconductor layer 10 and on the semiconductor region 11. An interlayer insulating film 71 is provided on the insulating film 70. A contact 61 connected to the electrode 60 and an electrode 62 connected to the contact 61 are provided in the interlayer insulating film 71. The insulating film 70 or the interlayer insulating film 71 may be removed as necessary.

Other than these, the semiconductor device 1 includes an element, an interconnection, etc. (not shown) on the front surface 10ss side of the semiconductor layer 10. The element is an active element such as a transistor and a diode, a passive element such as a resistance and a capacitor, a memory element, or the like, for example. The planar shape of the conductive layers 20A to 20D is not limited to a circle but may be a polygon.

The semiconductor layer 10 contains a silicon crystal doped with an impurity element such as boron (B), for example. The semiconductor region 11 contains a silicon crystal doped with an impurity element such as phosphorus (P) and arsenic (As), for example.

The conductive layers 20A to 20D and the electrode 21 contain at least one of copper (Cu), tungsten (W), nickel (Ni), titanium (Ti), tin (Sn), and polysilicon, for example. The conductive layers 20A to 20D and the electrode 21 may be a stacked body in which at least one of copper (Cu), tungsten (W), nickel (Ni), titanium (Ti), tin (Sn), polysilicon, and the like is stacked, for example.

The electrodes 60 and 62 and the contact 61 contain at least one of aluminum (Al), copper (Cu), tungsten (W), and polysilicon. The electrodes 60 and 62 and the contact 61 may be a stacked body in which at least one of aluminum (Al), copper (Cu), tungsten (W), polysilicon, and the like is stacked.

The insulating films 25 and 70 and the interlayer insulating film 71 contain at least one of silicon oxide ($SiO_2$), silicon nitride ($Si_3N_4$), and the like, for example. The insulating films 25 and 70 and the interlayer insulating film 71 may be a stacked body in which at least one of silicon oxide ($SiO_2$), silicon nitride ($Si_3N_4$), and the like is stacked, for example. The insulating layer 80 contains at least one of silicon oxide ($SiO_2$), silicon nitride ($Si_3N_4$), a resin, and the like, for example.

The manufacturing process of the semiconductor device 1 will now be described.

FIG. 2A to FIG. 4B are schematic cross-sectional views showing the manufacturing process of the semiconductor device according to the first embodiment. FIG. 2A to FIG. 4B show a cross section taken along line A-A' described above, as the manufacturing process of the semiconductor device according to the first embodiment.

Figure 2A:
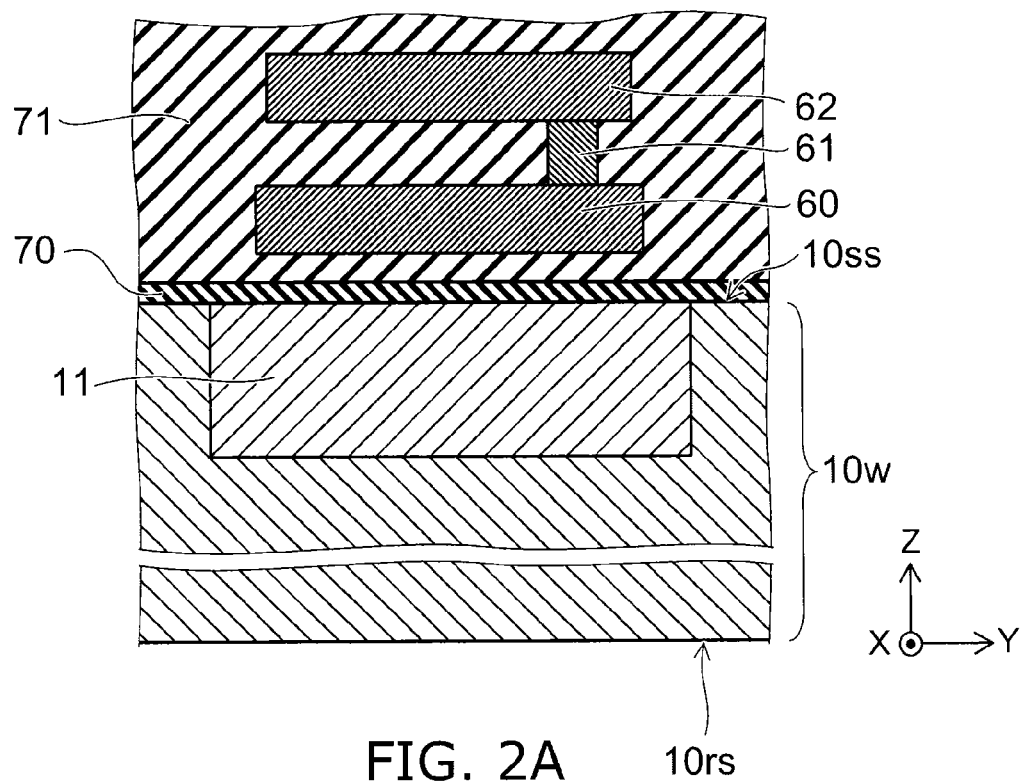
FIG. 2A to FIG. 4B are schematic cross-sectional views showing the manufacturing process of the semiconductor device according to the first embodiment.

First, as shown in FIG. 2A, on the front surface 10ss side of a p-type semiconductor substrate (semiconductor wafer) 10w, the semiconductor region 11, the insulating film 70, the electrodes 60 and 62, the contact 61, and the interlayer insulating film 71 are formed by a wafer process. Further, an element, an interconnection, etc. are formed on the front surface 10ss side of the semiconductor substrate 10w by a wafer process (not shown). In the wafer process, photolithography technology, etching technology, film formation technology, grinding technology, ion implantation technology, etc. are introduced. The thickness in the Z direction of the semiconductor substrate 10w at this stage is 1 mm or less (e.g. 0.8 mm), for example. In the first embodiment, the semiconductor region 11 is formed by photolithography technology and ion implantation technology, for example.

Thus far, generally an STI (shallow trench isolation) element isolation region has been provided in the front surface 10ss of the p-type semiconductor substrate (semiconductor wafer) 10w and a through via has been formed under the element isolation region. The region where one through via is formed has thus far been a region with a large area (usually, a diameter of 50 μm or more). The STI formation is influenced by the dishing effect due to CMP processing to cause a yield reduction of semiconductor devices. In contrast, in the structure of the embodiment, the TSV formation region has no STI accompanied by the dishing effect.

Figure 2B:
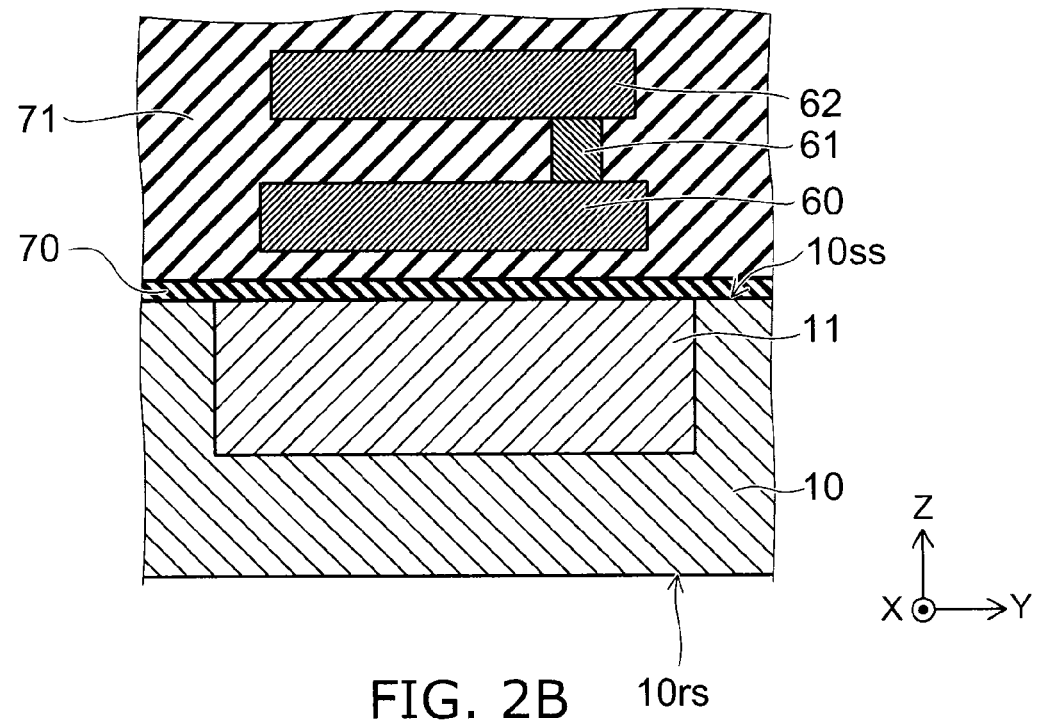

Next, as shown in FIG. 2B, the semiconductor substrate 10w is made thin to form the semiconductor layer 10. For example, the back surface 10rs of the semiconductor substrate 10w is ground by CMP (chemical mechanical polishing) to form a thin semiconductor layer 10. The thickness in the Z direction of the semiconductor layer 10 at this stage is 20 μm to 50 μm, for example.

Figure 3A:
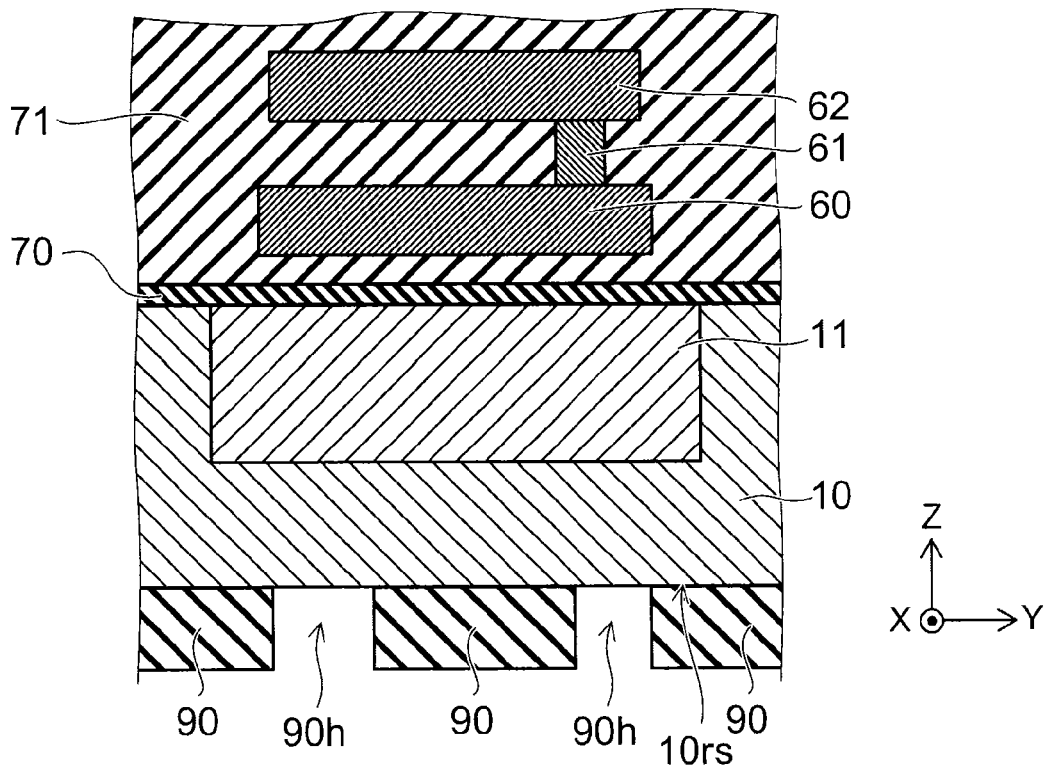

Next, as shown in FIG. 3A, a mask layer 90 is patterned on the back surface 10rs side of the semiconductor layer 10. The patterning of the mask layer 90 is performed according to photolithography, etching, etc., for example. The mask layer 90 includes an insulating layer of silicon oxide ($SiO_2$), silicon nitride ($Si_3N_4$), or the like, a resist, or the like. The positions of the openings 90h of the mask layer 90 correspond to the positions of the conductive layers 20A and 20B described above.

As described above, FIG. 3A is a cross section corresponding to the position of line A-A' of FIG. 1A. The opening 90h is actually formed also in the positions of the conductive layers 20C and 20D described above.

Figure 3B:
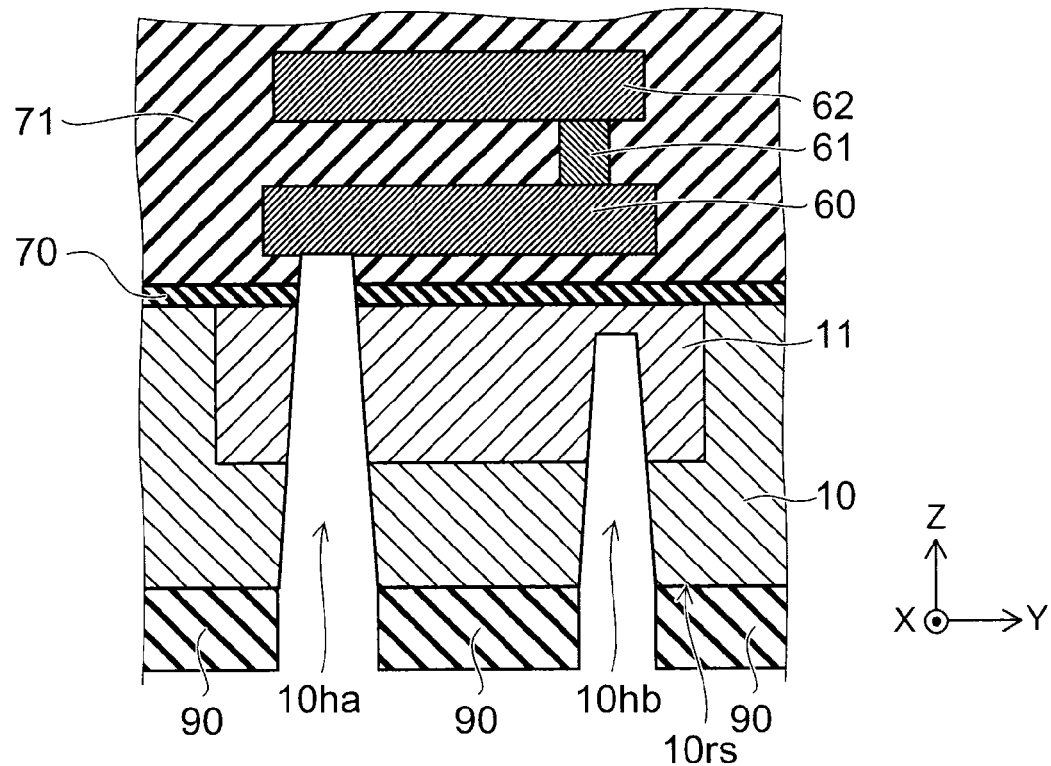

Next, as shown in FIG. 3B, etching processing is performed on the semiconductor layer 10 exposed from the mask layer 90 in the opening 90h. The etching processing is RIE (reactive ion etching), for example. Thereby, a via hole 10ha and a via hole 10*hb* are formed in the semiconductor layer 10, for example. A via hole is formed also in the positions of the conductive layers 20C and 20D described above. In other words, four via holes are formed at the stage of FIG. 3B.

To miniaturize the semiconductor device, it is preferable to form the via hole with as high an aspect ratio as possible. However, as the aspect ratio of the via hole increases, dry etching processing becomes more difficult. Hence, a phenomenon may occur in which one of the plurality of via holes etched from the back surface 10*rs* of the semiconductor layer 10 does not reach the front surface 10*ss*. For example, FIG. 3B shows a state where the via hole 10*hb* does not reach the front surface 10*ss* of the semiconductor layer 10 and the end of the via hole 10*hb* stops partway through the semiconductor region 11.

Figure 4A:
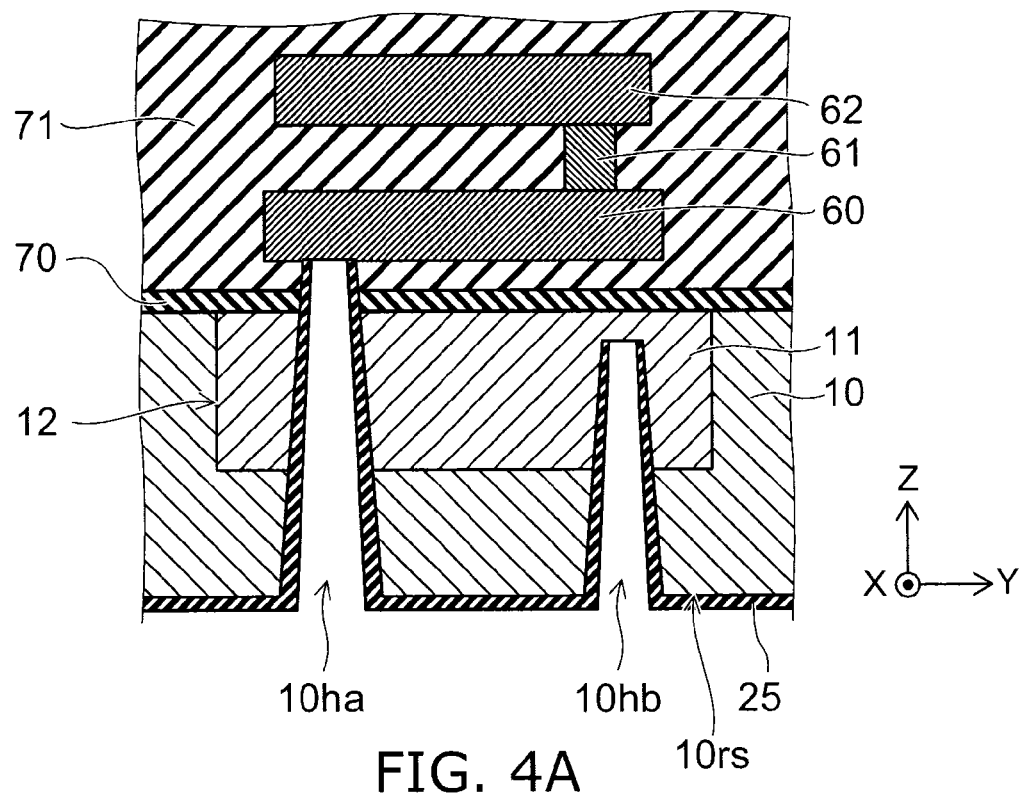

Next, as shown in FIG. 4A, the insulating film 25 is formed on the inner walls of the via holes 10*ha* and 10*hb* and on the back surface 10*rs* side of the semiconductor layer 10.

Figure 4B:
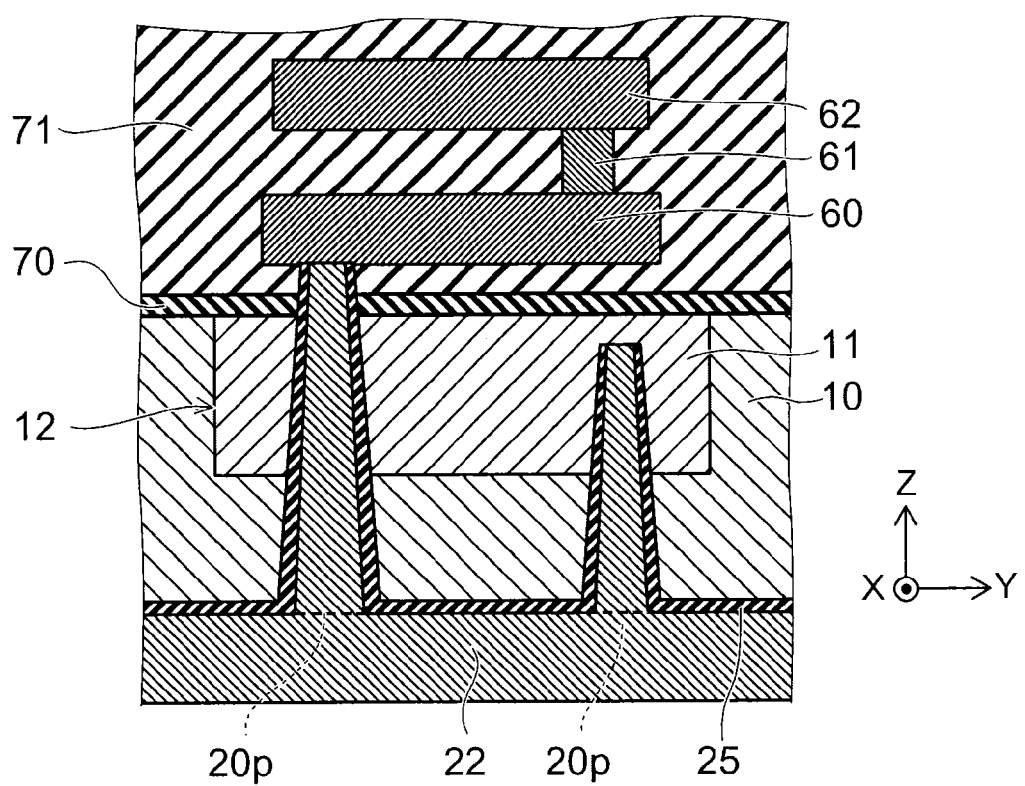

Next, as shown in FIG. 4B, a conductive layer 22 is formed on the inner walls of the via holes 10*ha* and 10*hb* and on the back surface 10*rs* side of the semiconductor layer 10 via the insulating film 25. The components of the conductive layer 22 are the same as those of the conductive layers 20A to 20D or the electrode 21.

After that, the conductive layer 22 is processed into the conductive layers 20A and 20B (see FIG. 1B). Also the conductive layers 20C and 20D are formed. After that, dicing processing is performed on the semiconductor layer 10 to fragment the semiconductor layer 10.

In the first embodiment, even when the via hole 10*hb* not penetrating exists during the manufacturing process, one of the other via holes penetrates from the back surface 10*rs* to the front surface 10*ss* of the semiconductor layer 10. Thus, a through via functioning normally is certainly provided in the semiconductor device 1. Therefore, in the semiconductor device 1, a malfunction in which the through via and the electrode 60 experience an open fault does not occur. In other words, even when there is a variation in the depth of the via hole, an open fault of the through via and the electrode 60 is prevented by forming a plurality of via holes and making one of the via holes reach the electrode 60.

The conductive layer 20B provided in the not-penetrating via hole 10*hb* is used as an unused electrode, for example. Alternatively, the conductive layer 20B may be used for uses other than the through via. The semiconductor device 1 has a structure in which reliability is not reduced even when the conductive layer 20B not reaching the electrode 60 is formed (described later).

The operation and effect of the semiconductor device 1 according to the first embodiment will now be described.

Figure 5:
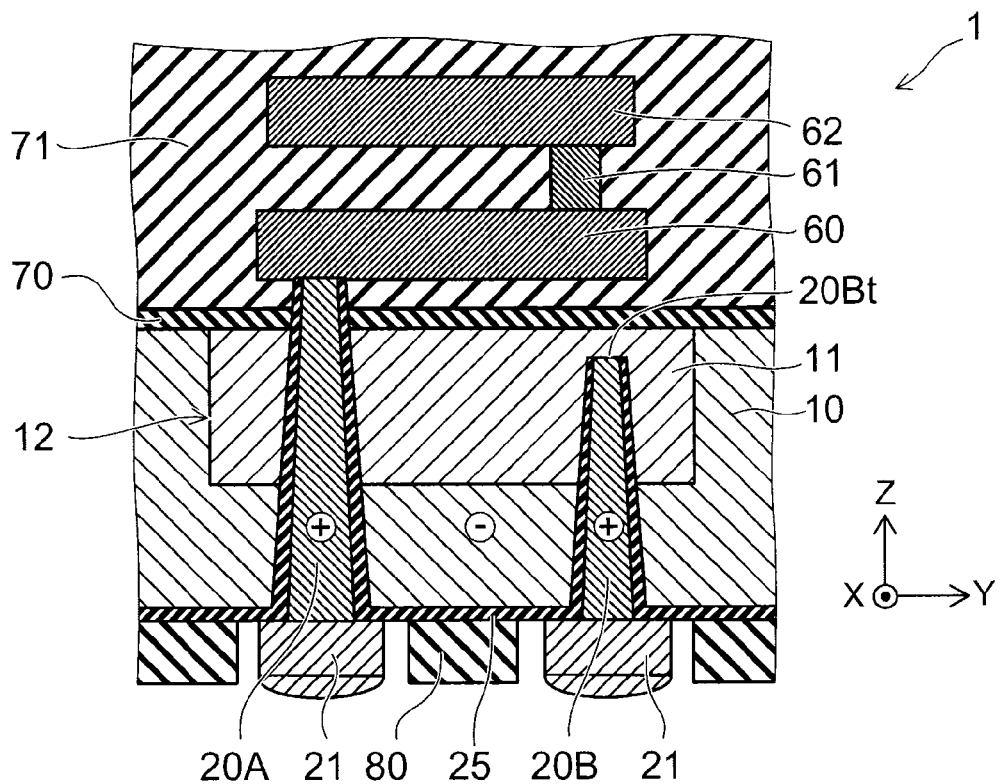
FIG. 5 is a schematic cross-sectional view showing the operation and effect of the semiconductor device according to the first embodiment.

FIG. 5 is a schematic cross-sectional view showing the operation and effect of the semiconductor device according to the first embodiment.

In the semiconductor device 1, in general, the electric potential of the semiconductor layer 10, which is a base substance, is kept at the ground potential, and a positive electrode potential is applied to the conductive layers 20A and 20B to drive the element.

Here, the conductive layer 20A is connected to the electrode 60. Therefore, the electric potential (e.g. a positive electrode potential) applied to the conductive layer 20A is normally conducted to the electrode 60. The conductive layer 20A, and the semiconductor layer 10 and the semiconductor region 11 are insulated by the insulating film 25. Therefore, the portions between the conductive layer 20A and the semiconductor layer 10 and between the conductive layer 20A and the semiconductor region 11 are in a structure through which a leak current does not flow.

On the other hand, the tip 20Bt of the conductive layer 20B does not reach the electrode 60. The tip 20Bt of the conductive layer 20B is in contact with the semiconductor region 11. The insulating film 25 is not provided between the tip 20Bt of the conductive layer 20B and the semiconductor region 11. Therefore, when, for example, a positive electrode potential is applied to the conductive layer 20B and the ground potential (alternatively, a negative electrode potential) is applied to the semiconductor layer 10, carriers in the conductive layer 20B may flow into the semiconductor region 11. In the drawing, a minus sign is shown in the semiconductor layer 10 as an example.

However, the semiconductor layer 10 is a p-type layer and the semiconductor region 11 is an n-type layer. Hence, the pn junction 12 is in a state where a reverse bias is applied whereby the p-type layer side becomes a negative electrode and the n-type layer side becomes a positive electrode. Thereby, the energy barrier in the pn junction 12 becomes larger, and carrier diffusion from the conductive layer 20B to the semiconductor layer 10 is suppressed. In other words, the semiconductor device 1 has a structure in which a current leak is less likely to occur between the conductive layer 20B and the semiconductor layer 10 even when the conductive layer 20B stops partway through the semiconductor region 11. Therefore, the electric potential of the semiconductor layer 10 is stabilized, and an element provided on the front surface 10*ss* side of the semiconductor layer 10 is driven stably. Thus, in the semiconductor device 1, there is no operational malfunction, and a faulty operation and a yield reduction are less likely to occur.

Figure 6:
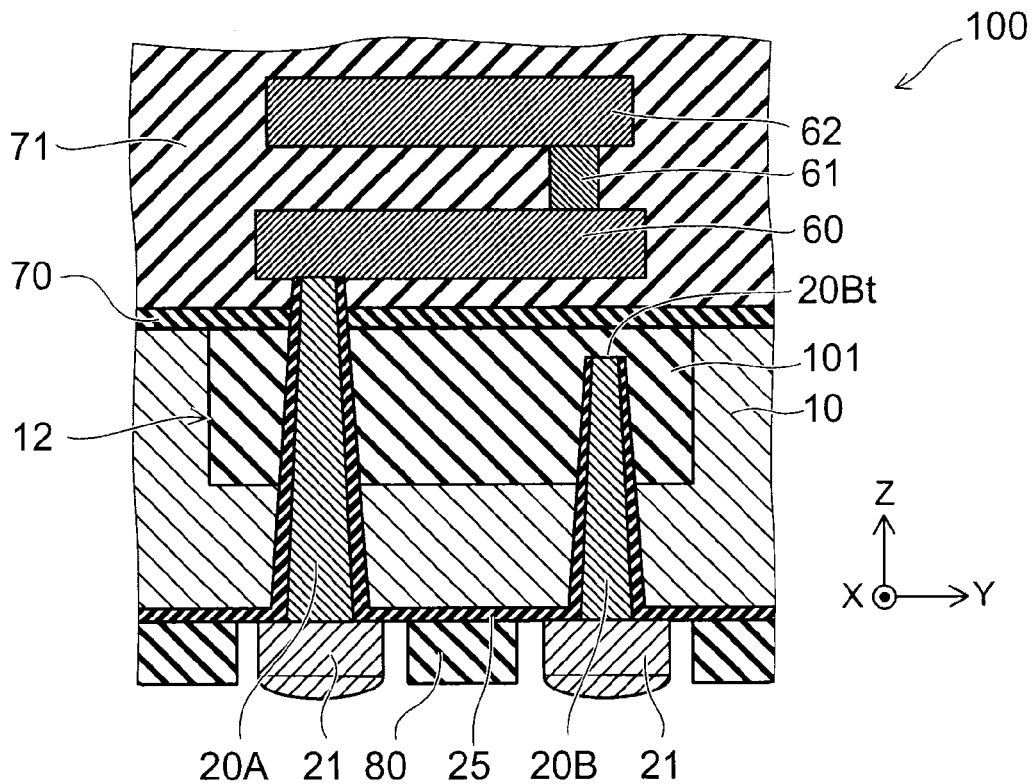
FIG. 6 is a schematic cross-sectional view of a semiconductor device according to a reference example.

FIG. 6 is a schematic cross-sectional view of a semiconductor device according to a reference example.

FIG. 6 shows a semiconductor device 100 in which the semiconductor region 11 is replaced with an insulating layer 101. In the semiconductor device 100, the tip 20Bt of the conductive layer 20B is surrounded by the insulating layer 101. Therefore, carrier diffusion from the conductive layer 20B is suppressed by the insulating layer 101.

However, to form the insulating layer 101, a CMP process that grinds the front surface side of the insulating layer 101 is needed. Hence, in the actual process, the thickness of the insulating layer 101 may be decreased differentially due to the dishing effect of the CMP. Such a state reduces the insulating properties of the insulating layer 101.

Since the insulating properties of the insulating layer 101 are reduced, in the semiconductor device 100 it is necessary that an element, an interconnection, etc. be placed distant from the insulating layer 101. Thus, an increase in the size of the semiconductor device is caused in the reference example.

In contrast, in the semiconductor device 1, the insulating layer 101 is not needed. Thereby, there is no need to consider the dishing effect of the insulating layer 101. Thus, it is not necessary to dispose an element, an interconnection, etc. distant from the insulating layer 101. Thus, the size of the semiconductor device can be made smaller.

Second Embodiment

Figure 7A:
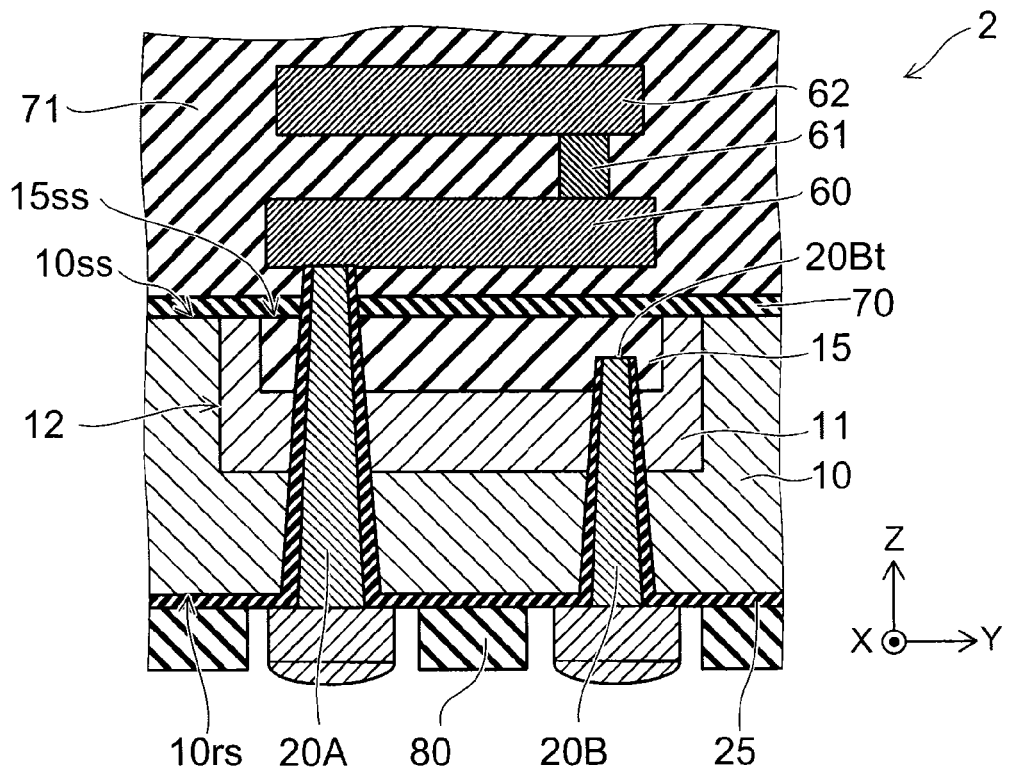
FIG. 7A and FIG. 7B are schematic cross-sectional views showing a semiconductor device according to a second embodiment.
Figure 7B:
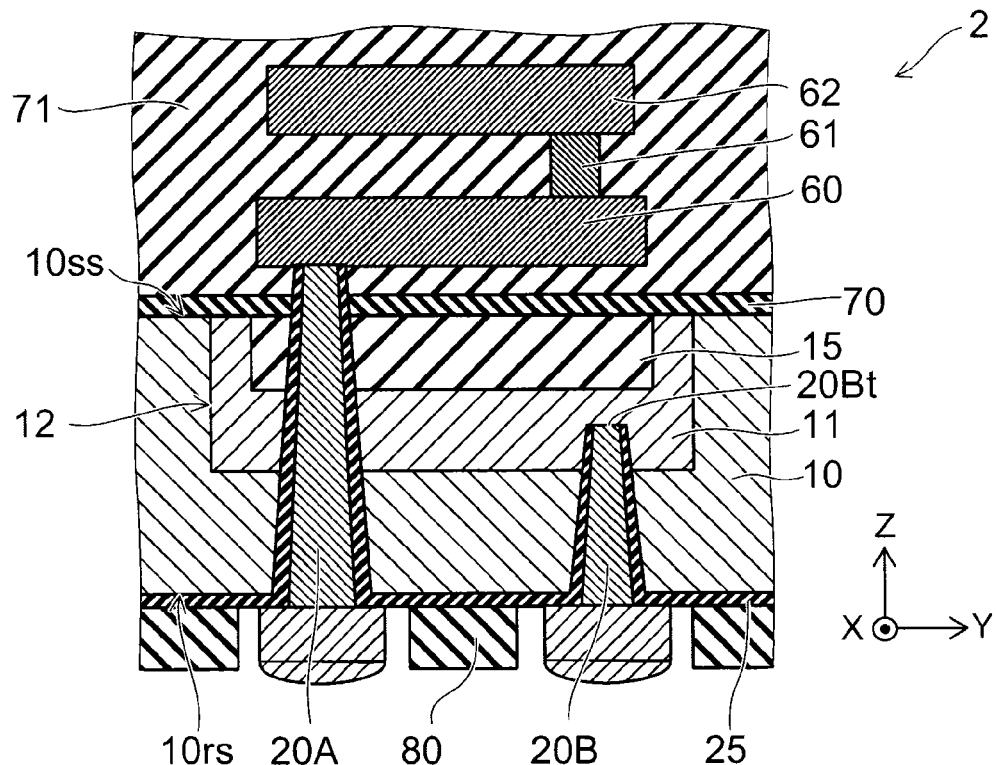

FIG. 7A and FIG. 7B are schematic cross-sectional views showing a semiconductor device according to a second embodiment.

FIG. 7A and FIG. 7B show a cross section corresponding to the position of line A-A' of FIG. 1A.

The basic structure of a semiconductor device 2 according to the second embodiment is the same as the basic structure of the semiconductor device 1 according to the first embodiment. The semiconductor device 2 further includes an insulating layer 15. The insulating layer 15 surrounds part (for example, an upper portion) of the conductive layer 20A via the insulating film 25 on the front surface 10ss side of the semiconductor layer 10. In the insulating layer 15, portions other than the front surface 15ss of the insulating layer 15 (for example, a lower portion and a side portion of the insulating layer 15) are surrounded by the semiconductor region 11.

FIG. 7A shows a state where the conductive layer 20B is in contact with the insulating layer 15. FIG. 7B shows a state where the conductive layer 20B is not in contact with the insulating layer 15.

In the semiconductor device 2, in the case where the conductive layer 20B is in contact with the insulating layer 15 (FIG. 7A), the tip 20Bt of the conductive layer 20B is surrounded by the insulating layer 15. Therefore, carrier diffusion from the conductive layer 20B is suppressed by the insulating layer 15.

On the other hand, in the case where the conductive layer 20B is not in contact with the insulating layer 15 (FIG. 7B), the tip 20Bt of the conductive layer 20B is surrounded by the semiconductor region 11. In this case, carrier diffusion from the conductive layer 20B to the semiconductor layer 10 is suppressed by the same operation as the semiconductor device 1 due to the existence of the pn junction 12.

Thus, the semiconductor device 2 has a structure in which a current leak is less likely to occur between the conductive layer 20B and the semiconductor layer 10. Thus, in the semiconductor device 2, there is no operational malfunction, and a faulty operation and a yield reduction are less likely to occur.

Furthermore, in the semiconductor device 2, since the insulating layer 15 is provided under the insulating film 70, the breakdown voltage between the electrode 60, and the semiconductor layer 10 and the semiconductor region 11 is further increased.

Third Embodiment

Figure 8A:
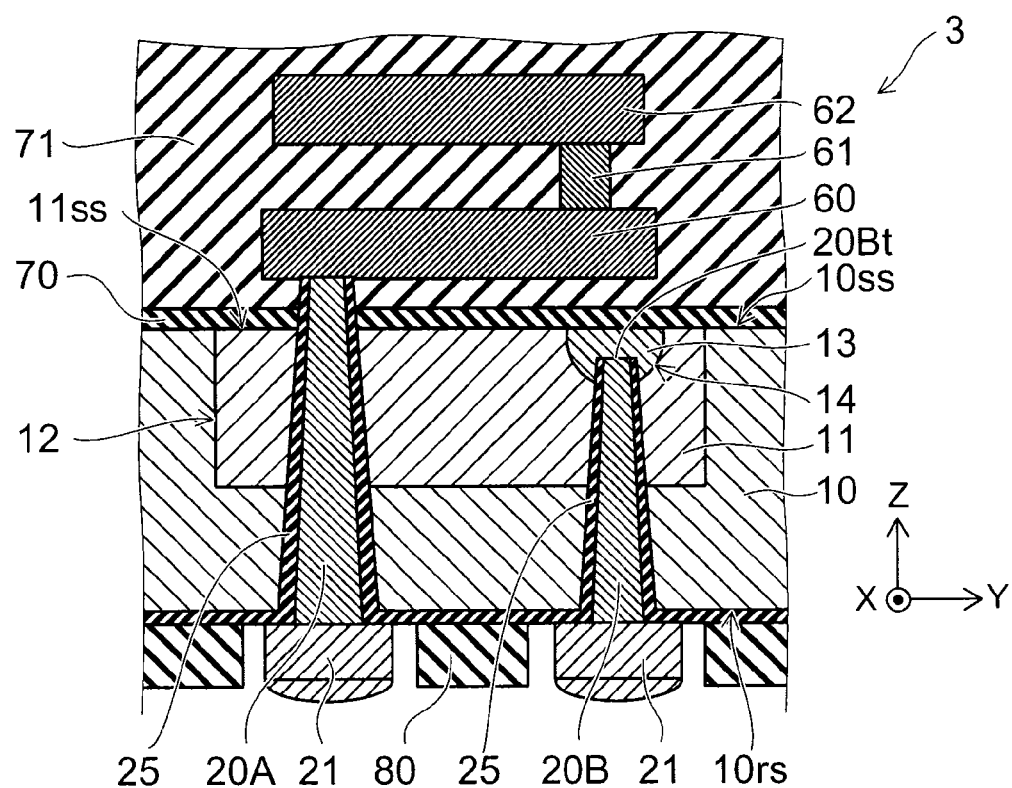
FIG. 8A is a schematic cross-sectional view showing a semiconductor device according to a third embodiment.
Figure 8B:
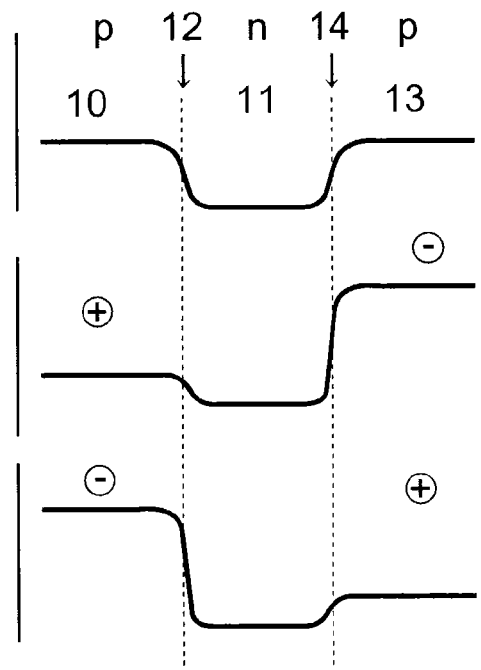
FIG. 8B is a diagram showing band structures of the semiconductor layer of the semiconductor device according to the third embodiment.

FIG. 8A is a schematic cross-sectional view showing a semiconductor device according to a third embodiment, and FIG. 8B is a diagram showing band structures of the semiconductor layer of the semiconductor device according to the third embodiment.

FIG. 8A shows a cross section corresponding to the position of line A-A' of FIG. 1A.

The basic structure of a semiconductor device 3 according to the third embodiment is the same as the basic structure of the semiconductor device 1 according to the first embodiment. The semiconductor device 3 further includes a semiconductor region 13 of a second conductivity type (a second semiconductor region). The semiconductor region 13 is provided between the conductive layer 20B and the semiconductor region 11.

In the case where the conductive layer 20B contains copper (Cu), copper may diffuse from the tip 20Bt of the conductive layer 20B, for example. In this case, a p-type semiconductor region 13 is formed between the conductive layer 20B and the semiconductor region 11. The embodiment includes a configuration in which the p-type semiconductor region 13 is provided between the conductive layer 20B and the semiconductor region 11. In the semiconductor device 3, the pn junction 12 and a pn junction 14 are formed.

The upper portion of FIG. 8B shows a band structure of a state where no bias from the outside is applied between the semiconductor layer 10, the semiconductor region 11, and the semiconductor region 13. In this case, a barrier based on the diffusion potential is formed in each of the pn junctions 12 and 14.

The middle portion of FIG. 8B shows a band structure of a state where a positive electrode potential is applied to the semiconductor layer 10 and a negative electrode potential is applied to the conductive layer 20B. A negative electrode potential is applied to the semiconductor region 13 connected to the conductive layer 20B. In this case, the pn junction 12 becomes forward biased. However, the pn junction 14 becomes reverse biased. Thereby, the energy barrier in the pn junction 14 becomes larger, and carrier diffusion from the conductive layer 20B to the semiconductor layer 10 is suppressed.

The lower portion of FIG. 8B shows a band structure of a state where a negative electrode potential is applied to the semiconductor layer 10 and a positive electrode potential is applied to the conductive layer 20B. A positive electrode potential is applied to the semiconductor region 13 connected to the conductive layer 20B. In this case, the pn junction 14 becomes forward biased. However, the pn junction 12 becomes reverse biased. Thereby, the energy barrier in the pn junction 12 becomes larger, and carrier diffusion from the conductive layer 20B to the semiconductor layer 10 is suppressed.

Thus, the semiconductor device 3 has a structure in which a current leak is less likely to occur both in the case where a positive electrode potential is applied to the conductive layer 20B and a negative electrode potential is applied to the semiconductor layer 10 and in the case where a negative electrode potential is applied to the conductive layer 20B and a positive electrode potential is applied to the semiconductor layer 10. Thus, in the semiconductor device 3, there is no operational malfunction, and a faulty operation and a yield reduction are less likely to occur.

Also a structure in which FIG. 7B and FIG. 8B are combined is included in the embodiment.

In the embodiment, the p type is taken as the first conductivity type and the n type is taken as the second conductivity type. Also structures in which the p type and the n type are exchanged to take the n type as the first conductivity type and the p type as the second conductivity type are included in the embodiment.

The term "on" in "a portion A is provided on a portion B" refers to the case where the portion A is provided on the portion B such that the portion A is in contact with the portion B and the case where the portion A is provided above the portion B such that the portion A is not in contact with the portion B.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a semiconductor substrate of a first conductivity type, the semiconductor substrate having a first surface and a second surface on an opposite side to the first surface;
   a plurality of conductive layers extending in a direction from the first surface side toward the second surface side of the semiconductor substrate, the conductive layers including a first via and a second via;
   a first semiconductor region of a second conductivity type surrounding part of each of the plurality of conductive layers on the second surface side of the semiconductor substrate, a portion other than a front surface of the first semiconductor region being surrounded by the semiconductor substrate;
   a first electrode provided on the second surface side of the semiconductor substrate;
   a plurality of second electrodes provided on the first surface side of the semiconductor substrate, one of the second electrodes being contact with one of the conductive layers; and
   an insulating film provided between each of the plurality of conductive layers and the semiconductor substrate and between each of the plurality of conductive layers and the first semiconductor region,
   the first via piercing the semiconductor substrate and the first semiconductor region, the first via being in contact with the first electrode, and the second via stopping partway through the first semiconductor region.

2. The device according to claim 1, wherein a pn junction is formed by junction of the semiconductor substrate and the first semiconductor region.

3. The device according to claim 2, wherein an electric potential applied to the plurality of conductive layers is a positive electrode potential and an electric potential applied to the semiconductor substrate is a ground potential or a negative electrode potential.

4. The device according to claim 1, further comprising an insulating layer surrounding part of the first via on the second surface side of the semiconductor substrate, wherein the insulating film is provided between the insulating layer and the part of the first via, and a portion other than a front surface of the insulating layer is surrounded by the first semiconductor region.

5. The device according to claim 4, wherein the second via reaches the insulating layer.

6. The device according to claim 1, further comprising a second semiconductor region of a first conductivity type provided between the second via and the first semiconductor region.

7. The device according to claim 6, wherein the second semiconductor region reaches from the second surface of the semiconductor substrate to the second via.

8. The device according to claim 6, wherein
   a pn junction is formed by junction of the semiconductor layer substrate and the first semiconductor region and
   a pn junction is formed by junction of the second semiconductor region and the first semiconductor region.

* * * * *